United States Patent
Lee

(10) Patent No.: US 7,339,251 B2
(45) Date of Patent: Mar. 4, 2008

(54) SHALLOW TRENCH ISOLATION STRUCTURE AND FORMATION METHOD THEREOF

(75) Inventor: Sang Yong Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 259 days.

(21) Appl. No.: 11/026,926

(22) Filed: Dec. 30, 2004

(65) Prior Publication Data

US 2005/0139949 A1   Jun. 30, 2005

(30) Foreign Application Priority Data

Dec. 31, 2003   (KR) .................. 10-2003-0102047

(51) Int. Cl.
*H01L 29/00* (2006.01)
(52) U.S. Cl. ..................................... 257/510
(58) Field of Classification Search ............... 257/510, 257/511, 512, 513
See application file for complete search history.

(56) References Cited

U.S. PATENT DOCUMENTS

| | | | |
|---|---|---|---|
| 5,801,082 A | 9/1998 | Tseng | |
| 6,268,265 B1 * | 7/2001 | Hwang et al. | 438/424 |
| 6,479,367 B2 | 11/2002 | Park | |
| 6,500,726 B2 * | 12/2002 | Lee et al. | 438/424 |
| 6,627,514 B1 * | 9/2003 | Park et al. | 438/435 |
| 6,645,866 B2 * | 11/2003 | Park et al. | 438/692 |
| 6,645,867 B2 | 11/2003 | Dokumaci et al. | |
| 6,649,486 B1 | 11/2003 | Balakumar et al. | |
| 2003/0181019 A1 | 9/2003 | Efferenn et al. | |
| 2004/0029398 A1 * | 2/2004 | Lee et al. | 438/774 |
| 2004/0198019 A1 * | 10/2004 | Yasui et al. | 438/435 |
| 2006/0202301 A1 * | 9/2006 | Ohta et al. | 257/510 |

* cited by examiner

*Primary Examiner*—Tuan H. Nguyen
(74) *Attorney, Agent, or Firm*—Andrew D. Fortney

(57) ABSTRACT

A method for fabricating an STI structure in a semiconductor device is disclosed. A disclosed method comprises: forming a pad oxide layer and a pad nitride layer on a substrate in sequence; patterning the pad oxide layer and the pad nitride layer to expose a predetermined part of the surface of the silicon substrate; forming a trench by etching the exposed part of the silicon substrate; depositing a nitride layer inside the trench and on the entire surface of the resulting structure; forming a thin thermal oxide layer along the interface between a silicon substrate and the thin nitride layer; and performing a wet cleaning process to make a predetermined angle in the upper part of the trench.

13 Claims, 5 Drawing Sheets

SHALLOW TRENCH ISOLATION STRUCTURE AND FORMATION METHOD THEREOF

BACKGROUND OF THE INVENTION

1. Field of the Invention

The present disclosure relates generally to a semiconductor fabrication and, more particularly, to a shallow trench isolation (hereinafter referred to as "STI") structure and a method for preventing the occurrence of voids in an $O_3$-tetra ethyl ortho silicate (hereinafter referred to as "TEOS") layer and seams in the upper part of the STI structure.

2. Background of the Related Art

As the technology for a semiconductor device advances, the semiconductor device needs to achieve a high integration and operate at a high speed and, as a result, a high precision in a pattern size is required to form a miniaturized pattern. In detail, not only the width of the area for devices, but also the width of a device isolation structure, which constitute a large portion of a semiconductor device, have to be decreased to guarantee a relatively wider area for the devices. Thus, a pattern to form a device isolation structure as well as a pattern to form other devices has to be miniaturized and have the high precision.

For the device isolation structure of prior arts, a LOCOS process has been widely employed. However, the device isolation achieved by the LOCOS process has several shortcomings such as well-known bird's-beak. The bird's-beak, in particular, is formed at the edges of the device isolation structure and, therefore, increases the area of the device isolation structure and generates a leakage current.

Accordingly, various methods to solve such problems in the conventional LOCOS process have been suggested. One popular method is to form an STI structure as the device isolation.

FIGS. 1 through 5 are cross-sectional views illustrating an STI structure fabrication method in accordance to a prior art.

Referring to FIG. 1, a pad oxide layer 12 having the thickness of 150 Å is deposited on a silicon substrate 11. Subsequently, a pad nitride layer 13 having the thickness of 1600 Å is deposited on the pad oxide layer 12. Through a photolithography process, the pad oxide layer 12 and the pad nitride layer 13 are then patterned to expose a predetermined part of the surface of the silicon substrate 11. The exposed part of the silicon substrate is then etched by a predetermined depth to form a trench 14.

Referring to FIG. 2, a thin thermal oxide layer 15 is then grown on the inside of the trench 14 by a sacrificial oxidation process. The thin thermal oxide layer 15 cures damages caused during the etching process. Subsequently, an $O_3$-TEOS oxide layer 16 is filled into the trench 14 and deposited on the entire surface of the resulting structure.

Referring to FIG. 3, a chemical mechanical polishing (hereinafter referred to as "CMP") process is performed for the $O_3$-TEOS oxide layer 16 to expose the pad nitride layer 13.

Referring to FIG. 4, the pad nitride layer 13 is removed by a wet etch.

Referring to FIG. 5, the pad oxide layer 12 is removed by dipping the resulting structure into an HF solution for more than 1.5 times of the optimum time for removing an oxide layer. As a result, an STI structure is completed.

However, in accordance with the prior art, seams in the top of the STI structure and voids in the $O_3$-TEOS oxide layer can be generated, thereby detrimentally affecting the characteristic of the semiconductor device such as reliability and completeness.

SUMMARY OF INVENTION

An object of the present invention is to prevent the occurrence of voids in an $O_3$-TEOS oxide layer and seams in an STI structure by forming the sidewalls of a trench having a predetermined angle.

To achieve this object, in accordance with the purpose of the invention, as embodied and broadly described herein, a method for fabricating a device isolation comprising the steps of: forming a pad oxide layer and a pad nitride layer on a substrate in sequence; patterning the pad oxide layer and the pad nitride layer to expose a predetermined part of the surface of the silicon substrate; forming a trench by etching the exposed part of the silicon substrate; depositing a nitride layer inside the trench and on the entire surface of the resulting structure; forming a thin thermal oxide layer along the interface between a silicon substrate and the thin nitride layer; and performing a wet cleaning process to make a predetermined angle in the upper part of the trench.

In addition, the object is also achieved by an STI structure comprising: a trench with a predetermined depth on a substrate; a nitride layer inside the trench; a thin thermal oxide layer grown along the interface between the silicon substrate and the nitride layer; and an $O_3$-TEOS oxide layer filled into the trench.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Figure 1:
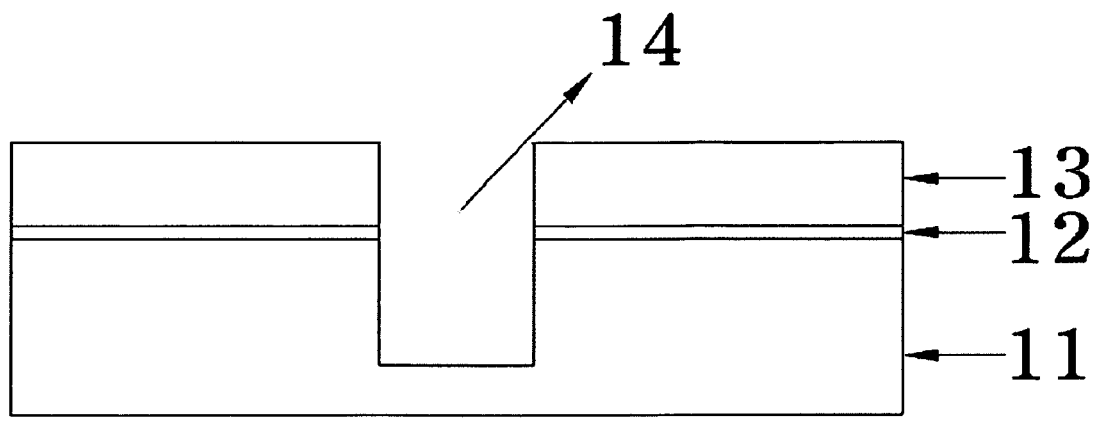
FIGS. 1 through 5 are cross-sectional views illustrating an STI structure fabrication method in accordance with a prior art.
Figure 2:
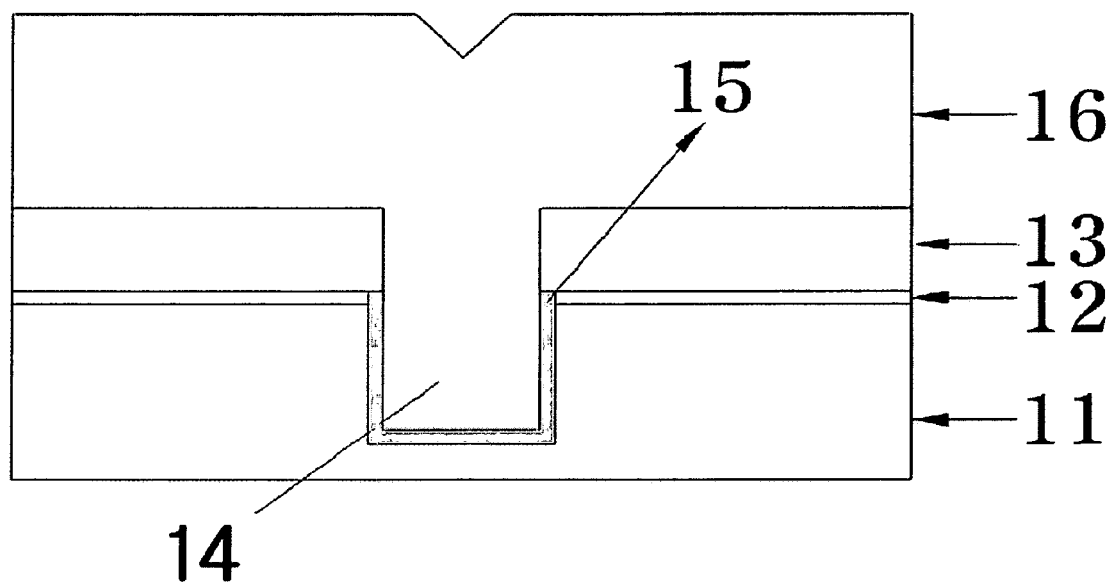
Figure 3:
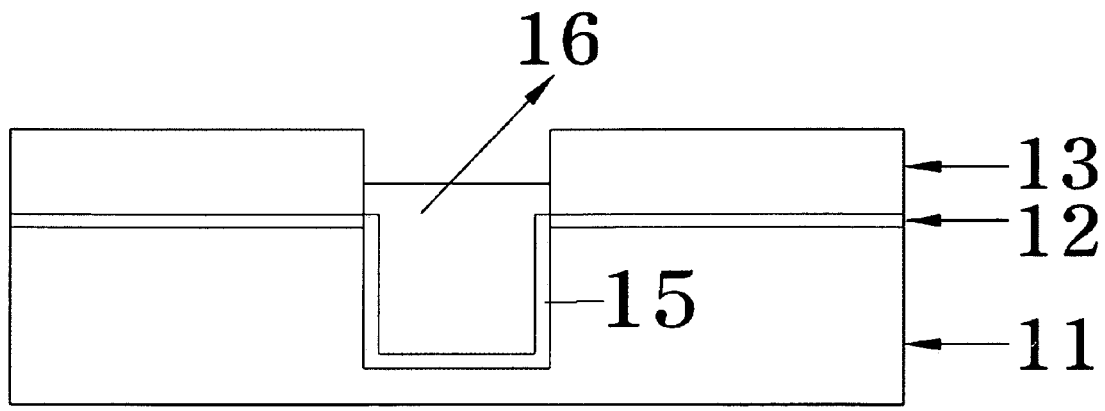
Figure 4:
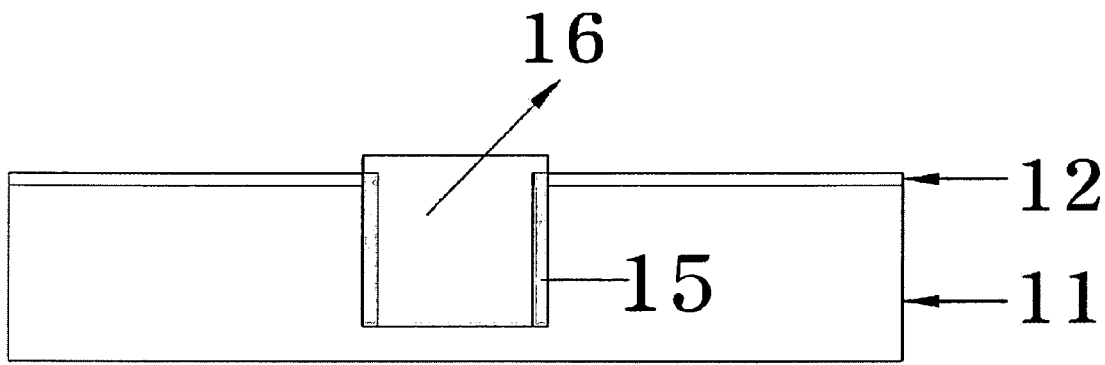
Figure 5:
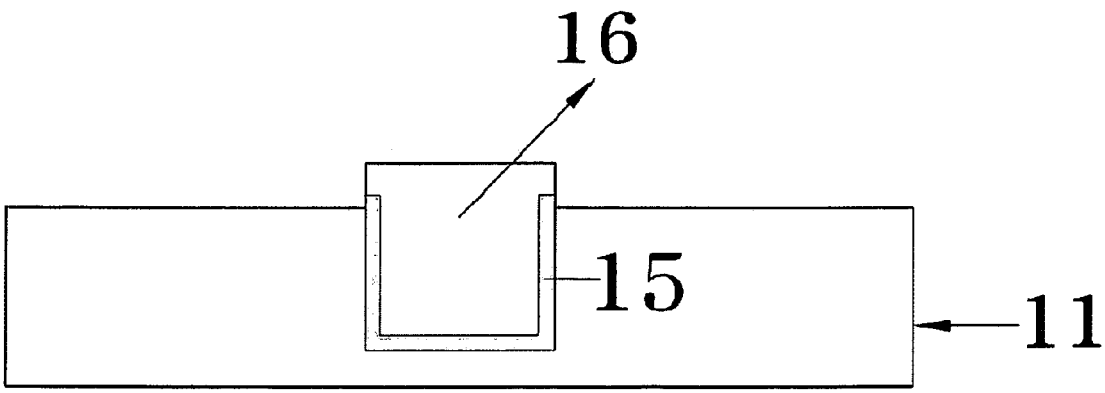
Figure 6:
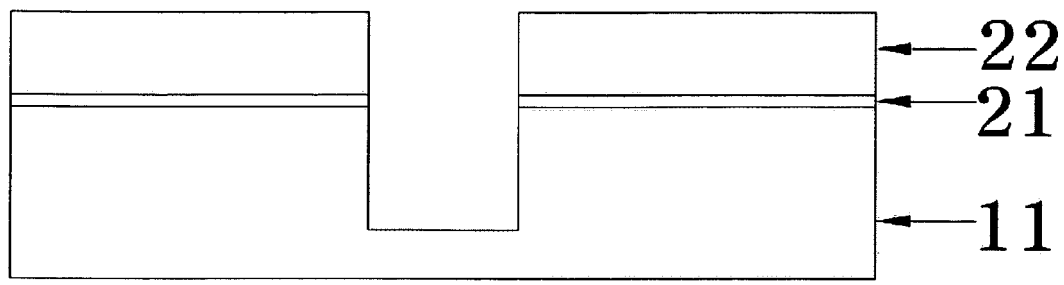
FIGS. 6 through 12 are cross-sectional views illustrating an STI structure fabrication method in accordance with the present invention.

Referring to FIG. 6, a pad oxide layer 21 having the thickness of 150 Å is formed on a silicon substrate 11. A pad nitride layer 22 having the thickness of 1400 Å is then formed on the pad oxide layer 21. The pad oxide layer 21 and the pad nitride layer 22 are then patterned through a photolithography process to expose a predetermined part of the surface of the silicon substrate 11. The exposed part of the silicon substrate 11 is then etched to form a trench by a predetermined depth between 6000 Å and 7000 Å, preferably, 6400 Å.

Figure 7:
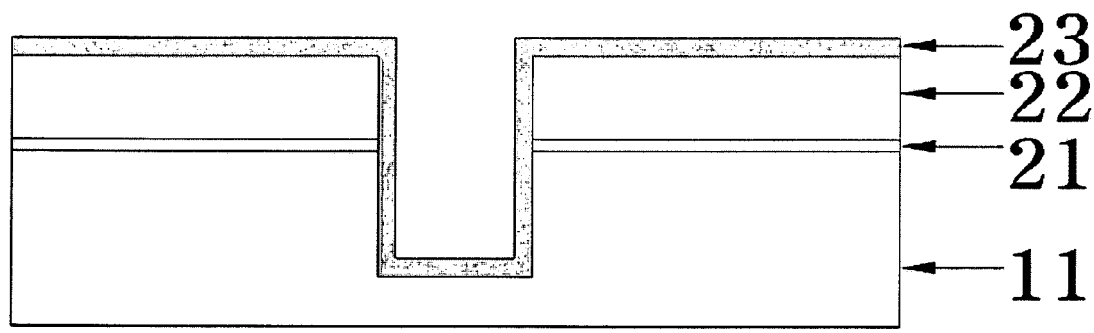

Referring to FIG. 7, a nitride layer 23 is deposited inside the trench and on the entire surface of the resulting structure. Preferably, the nitride layer 23 has a thickness between 100 Å and 300 Å, preferably, 200 Å.

Figure 8:
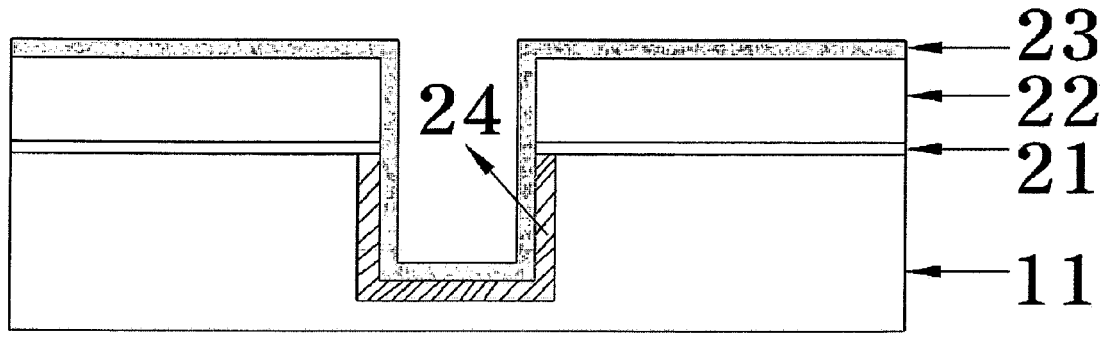

Referring to FIG. 8, a thin thermal oxide layer 24 is grown along the interface between the silicon substrate 11 and the nitride layer 23 by a sacrificial oxidation process. The thin thermal oxide layer 24 cures etching damages caused during the etching process for forming the trench.

Figure 9:
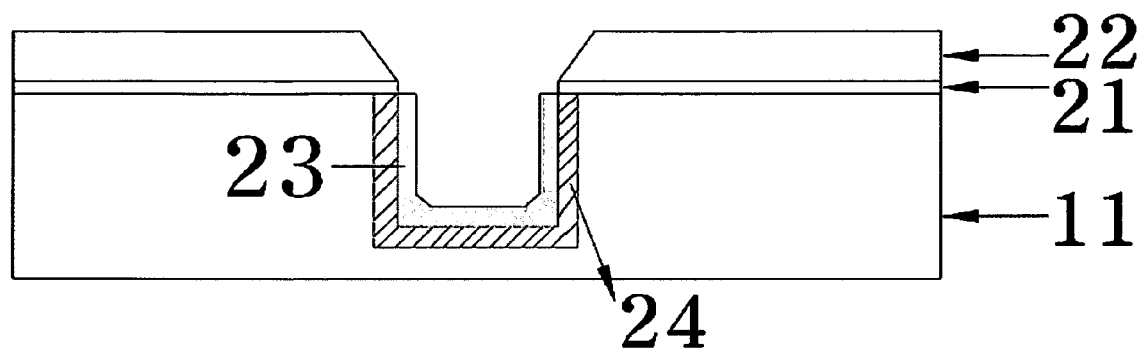

Referring to FIG. 9, a wet cleaning process using $H_3PO_4$ is performed to make a predetermined angle in the upper part of the trench. The predetermined angle is formed due to the etching difference between the upper part and the sidewalls of the trench through the wet cleaning process. The wet cleaning process using $H_3PO_4$ is performed for 5 minutes to 9 minutes and, preferably, 7 minutes. The nitride layer 23 is etched by 240 Å from the surface through the wet cleaning process for 7 minutes. The resulting STI structure has the predetermined angle in its upper part. The STI structure having the predetermined angle and the depth prevents the creation of the voids during the deposition of an $O_3$-TEOS oxide layer (not shown).

Figure 10:
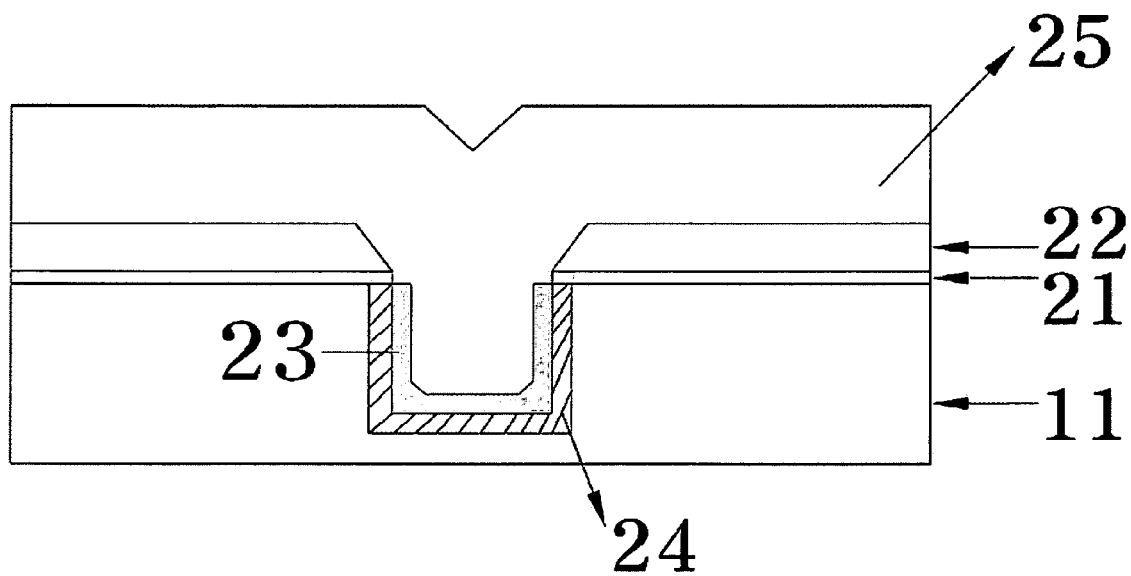

Thereafter, processes identical to the prior art are performed. Referring to FIG. 10, an $O_3$-TEOS oxide layer 25 is filled into the trench and deposited on the entire surface of the resulting structure.

Figure 11:
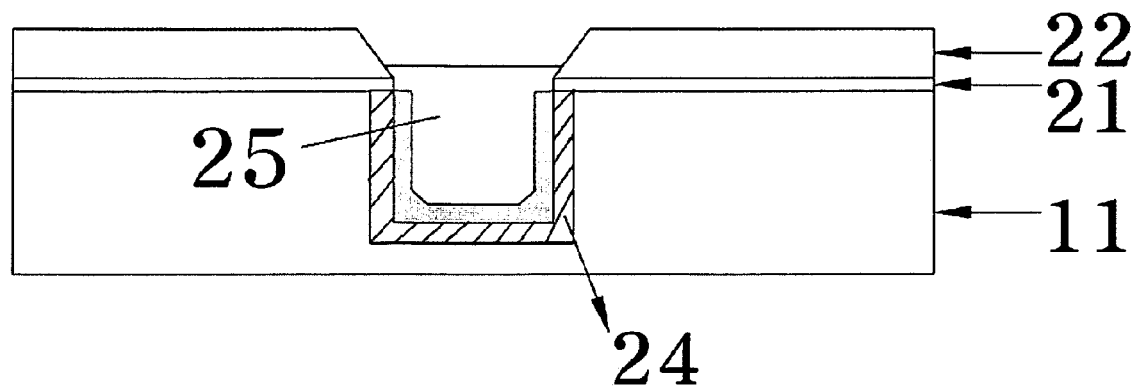

Referring to FIG. 11, a CMP process is performed for the $O_3$-TEOS oxide layer 25 until the pad nitride layer 22 is exposed.

Figure 12:
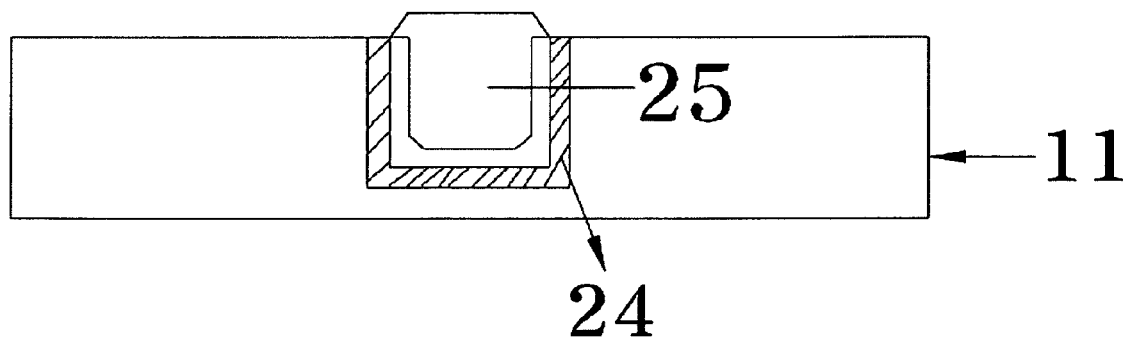

Referring to FIG. 12, the pad nitride layer 22 and the pad oxide layer 21 is removed. As a result, the STI structure is completed. Thus, as shown in FIG. 12, the STI structure in accordance with the present invention comprises a trench with a predetermined depth in a substrate, a nitride layer inside the trench, a thin thermal oxide layer along the interface between the silicon substrate and the nitride layer, and $O_3$-TEOS oxide filled into the trench.

Accordingly, the present invention prevents the occurrence of voids in the $O_3$-TEOS oxide layer and seams in an STI structure by forming a trench which has a predetermined angle in its upper part, therefore improving the characteristics of the semiconductor device such as reliability and completeness.

It is noted that this patent claims priority from Korean Patent Application Serial Number 10-2003-0102047, which was filed on Dec. 31, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. An STI structure comprising:
    a trench with a predetermined depth in a substrate;
    a nitride layer inside the trench, the nitride layer having a substantially planar upper surface that is coplanar with an upper surface of the trench;
    a thin thermal oxide layer along the interface between the silicon substrate and the nitride layer, the thin thermal oxide layer having a substantially planar upper surface that is coplanar with the upper surface of the nitride layer, and
    an insulation layer filling the trench, the insulation layer exposing the upper surface of the thin thermal oxide layer and covering the entire upper surface of the nitride layer.

2. An STI structure as defined by claim 1, wherein the trench has a depth between 6000 Å and 7000 Å.

3. An STI structure as defined by claim 1, wherein the nitride layer has a thickness between 100 Å and 300 Å.

4. An STI structure as defined by claim 1, wherein the insulation layer has an upper surface tat is higher than an uppermost surface of the nitride layer and an uppermost surface of the thin thermal oxide layer.

5. An STI structure as defined by claim 1, wherein the insulation layer is only on the nitride layer.

6. An STI structure as defined by claim 1, wherein the insulation layer comprises an $O_3$-TEOS oxide layer.

7. An STI structure as defined by claim 1, wherein a width of a top surface of the insulation layer is narrower than a width of the trench.

8. An STI structure as defined by claim 7, wherein the trench has a dept between 6000 Å and 7000 Å.

9. An STI structure as defined by claim 7, wherein the nitride layer has a thickness between 100 Å and 300 Å.

10. An STI structure as defined by claim 7, wherein the insulation layer has an upper surface that is higher than an uppermost surface of the nitride layer and an uppermost surface of the thin thermal oxide layer.

11. An STI structure as defined by claim 7, wherein the insulation layer is only on the nitride layer.

12. An STI structure as defined by claim 11, wherein the insulation layer exposes the thin thermal oxide layer.

13. An STI structure as defined by claim 7, wherein the insulation layer comprises an $O_3$-TEOS oxide layer.

* * * * *